United States Patent [19]

Fukuba et al.

[11] Patent Number: 5,260,602
[45] Date of Patent: Nov. 9, 1993

[54] HYBRID INTEGRATED-CIRCUIT DEVICE HAVING AN ASYMMETRICAL THERMAL DISSIPATOR

[75] Inventors: Yoshihiro Fukuba, Kawanishi; Hazime Kato, Itami, both of Japan

[73] Assignee: Mitsubishi Denki Kabushiki Kaisha, Tokyo, Japan

[21] Appl. No.: 850,025

[22] Filed: Mar. 12, 1992

[30] Foreign Application Priority Data

Mar. 15, 1991 [JP] Japan .................................. 3-51147

[51] Int. Cl.⁵ .................. H01L 39/02; H01L 23/02; H02B 1/00; H05K 5/00
[52] U.S. Cl. ................................. 257/712; 257/713; 257/718; 257/719; 361/380; 361/381; 361/386; 361/388; 361/389; 361/702; 361/711; 361/719
[58] Field of Search ............... 357/81; 257/713, 712, 257/717, 718, 719, 723, 706, 712, 720; 361/380, 388, 389, 381, 386

[56] References Cited

U.S. PATENT DOCUMENTS 4,867,235  9/1989  Grapes et al. .................... 357/81
5,050,039  9/1991  Edfors ............................. 357/81

*Primary Examiner*—Jerome Jackson
*Assistant Examiner*—Carl Whitehead, Jr.
*Attorney, Agent, or Firm*—Leydig, Voit & Mayer

[57] ABSTRACT

A hybrid integrated circuit device includes first and second circuit boards having heat emitting semiconductor devices mounted on each circuit board, the circuit boards being respectively attached to opposite sides of a heat radiating plate with an adhesive and extending in opposite directions beyond the heat radiating plate. The respective edges of the circuit boards extending beyond the heat radiating plate are grasped by clip leads for supporting the heat radiating plate and the two circuit boards on a main circuit board. Further, these clip leads electrically connect the semiconductor devices to external circuits.

4 Claims, 2 Drawing Sheets

HYBRID INTEGRATED-CIRCUIT DEVICE HAVING AN ASYMMETRICAL THERMAL DISSIPATOR

BACKGROUND OF THE INVENTION

1. Field of the Invention

This invention relates to a hybrid integrated-circuit device, which is mounted, for example, on an automobile or the like, as an electrical part.

2. Description of the Related Art

FIG. 4 shows a side view of a conventional hybrid integrated-circuit device, and FIG. 5 shows a top view of the same. A circuit pattern 2 (see FIG. 5) is formed on the right side of the circuit board 1. Further, a heat emitting semiconductor device 3 is mounted thereon. Formed in an edge section of the circuit board 1 are external connection terminals 4, as indicated by the broken line in FIG. 5. Leads 7 are respectively connected to these terminals to electrically connect the semiconductor device 3 to an external device. The leads 7 are connected to the terminals 4 by solder 5. And the circuit board 1 is attached to a heat radiating plate 8 by adhesive 6.

When operating, the semiconductor device 3 mounted on the circuit board 1 emanates heat. This heat is transmitted through the circuit board 1 to the heat radiating plate 8 attached the reverse side thereof and is diffused therefrom.

As can be seen from the above example, conventional hybrid integrated-circuit devices have to be rather large because of the structure in which the circuit board is attached to a heat radiating plate. Further, in the case of a circuit device wherein a circuit board is attached to each side of the heat radiation plate, there is a problem involved when securing the device in position, etc.

The present invention has been made with a view to eliminating the problems mentioned above. It is an object of this invention to provide a hybrid integrated-circuit device which allows heat emitting semiconductor devices to be mounted thereon with a higher rate of integration.

SUMMARY OF THE INVENTION

In order to achieve the above object, according to one aspect of the present invention, there is provided a hybrid integrated-circuit device comprising: a double-sided heat radiating means; an electric circuit means composed of first and second circuit boards which are respectively attached to first and second sides of the heat radiation means respectively extending in opposite directions beyond the heat radiating means and to provide a heat conductivity and on each of which a heat emitting circuit part is mounted; and a conductive support means stably supporting the heat radiating means and the electric circuit means manner at the respective extensions of the first and second circuit boards and electrically connecting the circuit parts to external circuits.

In accordance with this invention, two circuit boards each having a heat emitting circuit part mounted thereon are respectively attached to opposite sides of a heat radiating means respectively extending in opposite directions beyond the heat radiating means, and the ends of the respective extensions beyond the heat radiating means of the circuit boards are supported by a conductive support means. Due to this arrangement, the radiating means, having a circuit board attached to each side, can be supported and secured in position in a stable manner, with the circuit parts electrically connected to the exterior.

DESCRIPTION OF THE PREFERRED EMBODIMENT

Figure 1:
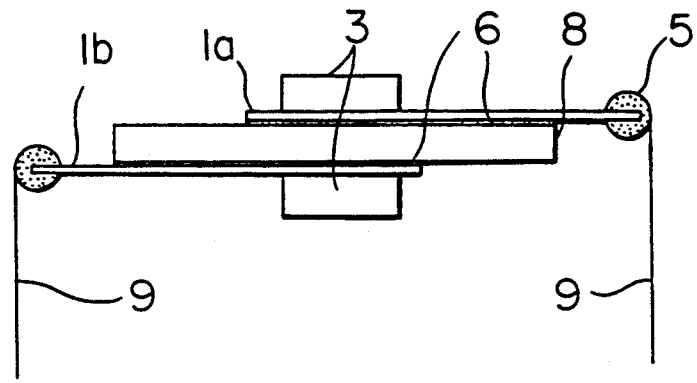
FIG. 1 is a side view of a hybrid integrated-circuit device in accordance with an embodiment of this invention.
Figure 2:
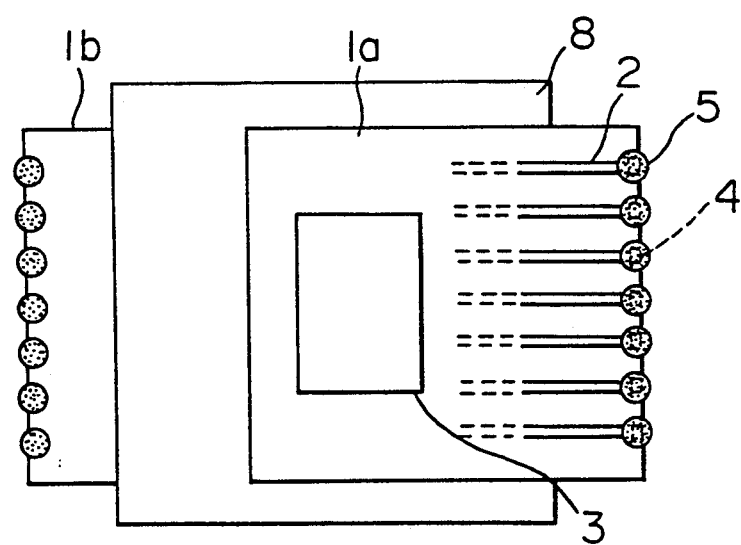
FIG. 2 is a top view of the device shown in FIG. 1.
Figure 4:
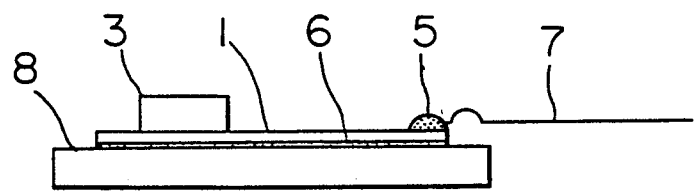
FIG. 4 is a side view of a conventional hybrid integrated-circuit device.
Figure 5:
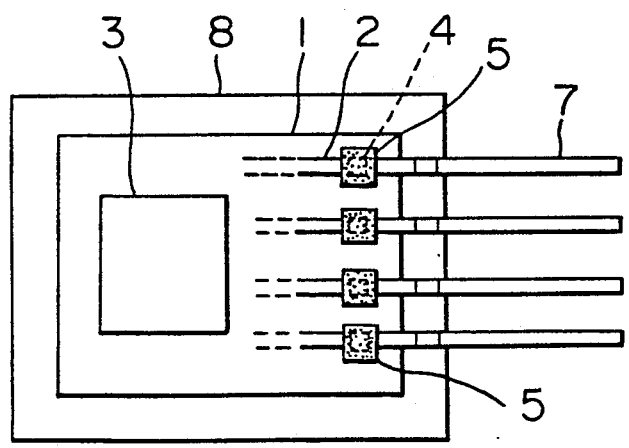
FIG. 5 is a top view of the device shown in FIG. 4.

An embodiment of this invention will now be described with reference to the accompanying drawings. In FIGS. 1 and 2, those components which are equivalent to those of FIGS. 4 and 5 are referred to by the same reference numerals. The heat radiating plate 8 constitutes the heat radiating means. The first and second circuit boards 1a and 1b, the circuit pattern 2, the semiconductor devices 3 serving as the circuit parts, the external connection terminals 4, and the solder 5 are part of the electric circuit means. The F-shaped clip leads 9 are a conductive support means.

This embodiment includes first and second boards 1a and 1b each having on the obverse side a semiconductor device 3 mounted thereon, with a circuit pattern 2 and external connection terminals 4 thereon, as in the above-described conventional device. These circuit boards 1a and 1b are respectively attached to the obverse and reverse sides of a heat radiating plate 8 by adhesive 6. The circuit boards 1a and 1b extend in opposite directions beyond the heat radiating plate 8 for the mounting of F-shaped clip leads 9 which are described below. The heat emanated from the semiconductor devices 3 is transmitted through the circuit boards 1a and 1b and the adhesive 6 to the heat radiating plate 8 and is diffused therefrom. The heat radiating plate 8 consists, for example, of an aluminum heat sink having a preselected level of thermal dissipation. Further, it is desirable that the adhesive 6 be a good conductor of heat.

Figure 3:
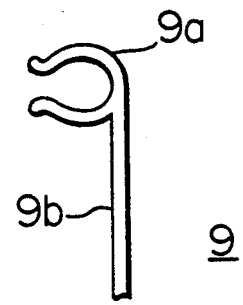
FIG. 3 is an enlarged side view of an F-shaped clip lead.

The external connection terminals 4 are formed at edges of the respective extensions beyond the heat radiation plate 8 of the circuit boards 1a and 1b for the mounting of the F-shaped clip leads 9 mentioned above. As shown in FIG. 3, each F-shaped clip lead 9 is composed of a clip section 9a and a lead section 9b extending therefrom. And, as shown in FIGS. 1 and 2, the clip sections 9a grasp the respective edges of the circuit boards 1a and 1b respectively in contact with the external connection terminals 4, with the lead sections 9b extending in a direction substantially perpendicular to the circuit boards. Further, the clip sections 9a are fixed to the external connection terminals 4 by solder 5. The F-shaped clip leads 9 have to support that section of the hybrid integrated-circuit device which is composed of the first and second circuit boards 1a and 1b and the heat radiating plate 8, in a stable manner as shown in the drawings, for example, on a main circuit board or on the body of an automobile or the like (neither of which is shown). Accordingly, the F-shaped clip leads 9 must be strong enough to support the boards in a stable manner.

While in the above embodiment each circuit board is only equipped with one semiconductor device, each circuit board in an actual hybrid integrated-circuit device usually has a plurality of semiconductor devices mounted on it. Further, what is mounted on the circuit board is not restricted to semiconductor devices. It may also be other types of heat emitting circuit parts or a combination of different types of circuit parts.

As described above, in a hybrid integrated-circuit device in accordance with this invention, two circuit boards with heat emitting semiconductor devices mounted thereon are respectively attached to opposite sides of a heat radiating plate respectively extending in opposite directions beyond this heat radiating plate, and F-shaped clip leads are provided at the edges of the respective extensions of the circuit boards for supporting the heat radiating plate and the two circuit boards and to electrically connect the semiconductor devices to external circuits. Due to this arrangement, the heat emitting semiconductors can be mounted with a higher integration density, thereby reducing the size and production cost of the device as compared to those of conventional devices. Furthermore, since the device is supported in a more stable manner at both ends, an improvement can be attained in terms of vibration resistance and reliability.

What is claimed is:

1. A hybrid integrated circuit device comprising:

heat radiating means having opposed first and second surfaces and opposed first and second sides transverse to the first and second surfaces, the first and second sides having respective first and second opposed edges;

first and second circuit boards, each circuit board having an obverse surface and a reverse surface opposed to the obverse surface and at least one edge transverse to the obverse and reverse surfaces;

at least one heat emitting circuit part mounted on the obverse surface of each of said first and second circuit boards, the reverse surfaces of said first and second circuit boards being respectively attached to said first and second surfaces of said heat radiating means, said first circuit board extending beyond the first edge of said heat radiating means in a first direction and said second circuit board extending beyond the second edge of said heat radiating means in a second direction opposite the first direction to provide a predetermined heat conductivity; and conductive support means for stably supporting said heat radiating means and said first and second circuit boards at the respective edges of said first and second circuit boards respectively extending beyond the first and second opposed edges of said heat radiating means and electrically connected to said circuit parts.

2. The hybrid integrated circuit device as claimed in claim 1 wherein said heat radiating means includes a heat radiating plate, each of said first and second circuit boards has a circuit pattern and a plurality of external connection terminals disposed at the edges of said first and second circuit boards that extend beyond said heat radiating plate and are connected to said respective circuit patterns and wherein said conductive support means includes a plurality of clips, each clip including a clip section grasping an edge of one of said first and second circuit boards extending beyond said heat radiating plate and in electrical contact with one of said external connection terminals and a linear lead section extending substantially perpendicular to said heat radiating plate and the obverse and reverse surfaces of said first and second circuit boards.

3. The hybrid integrated circuit device as claimed in claim 2 wherein said heat radiating plate includes an aluminum heat sink.

4. The hybrid integrated circuit device as claimed in claim 2 including an adhesive bonding said first and second circuit boards to said heat radiating plate, said adhesive having a predetermined heat conductivity.

* * * * *